(12) United States Patent
Katogi et al.

(10) Patent No.: US 7,795,325 B2
(45) Date of Patent: *Sep. 14, 2010

(54) ADHESIVE COMPOSITION, ADHESIVE COMPOSITION FOR CIRCUIT CONNECTION, CONNECTED BODY SEMICONDUCTOR DEVICE

(75) Inventors: Shigeki Katogi, Tsukuba (JP); Hoko Suto, Tsukuba (JP); Masami Yusa, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/492,492

(22) Filed: Jun. 26, 2009

(65) Prior Publication Data

US 2009/0261483 A1  Oct. 22, 2009

Related U.S. Application Data

(60) Division of application No. 11/138,645, filed on May 27, 2005, now Pat. No. 7,576,141, which is a continuation-in-part of application No. PCT/JP03/15351, filed on Dec. 1, 2003.

(30) Foreign Application Priority Data

Nov. 29, 2002  (JP) ............................ P2002-348026

(51) Int. Cl.
*C08F 2/46* (2006.01)
*C08F 2/50* (2006.01)
*C08J 3/28* (2006.01)

(52) U.S. Cl. .................... 522/162; 522/163; 522/164; 522/178; 522/182; 428/356; 428/355 BL; 428/355 N; 428/355 AC; 428/355 CN; 428/355 EN; 427/457; 427/487; 427/508; 427/516; 427/207.1; 427/208.2; 427/208.4

(58) Field of Classification Search .............. 428/356, 428/355 BL, 355 N, 355 AC, 355 CN, 355 EN; 427/457, 487, 508, 516, 207.1, 208.2, 208.4; 522/162–182, 185, 184, 186

See application file for complete search history.

(56) References Cited

U.S. PATENT DOCUMENTS

2007/0156408 A1  7/2007  Saito et al.

FOREIGN PATENT DOCUMENTS

| JP | 01-113480 A | 5/1989 |
|----|----|----|
| JP | 09-125011 A | 5/1997 |
| JP | 09-241585 A | 9/1997 |
| JP | 11026688 A | 1/1999 |
| JP | 11-50032 A | 2/1999 |
| JP | 11-140387 A | 5/1999 |
| JP | 2000072851 A | 3/2000 |
| JP | 2000-239616 A | 9/2000 |
| JP | 2001-011135 A | 1/2001 |
| JP | 2002-012603 A | 1/2002 |
| JP | 2002-012637 A | 1/2002 |
| JP | 2002-012738 A | 1/2002 |
| JP | 2002-167556 A | 6/2002 |
| JP | 2002-203427 A | 7/2002 |
| JP | 2002-363218 A | 12/2002 |
| JP | 2003-321508 A | 11/2003 |
| JP | 2004-018715 A | 1/2004 |

OTHER PUBLICATIONS

Taiwanese Office Action dated Feb. 2, 2007, issued in corresponding Taiwanese Patent Application No. 92133727.
Chinese Office Action dated Feb. 10, 2009 (dispatch date), issued in corresponding Chinese Patent Application No. 2003801005869.
Japanese Office Action dated Jun. 24, 2008 (mailing date), issued in corresponding Japanese Patent Application No. 2004-556874.
Japanese Office Action dated Apr. 22, 2010, issued in corresponding Japanese Patent Application No. 095147924.
Taiwanese Office Action dated Jun. 3, 2010, issued in Taiwanese Patent Application No. 09920383560.

*Primary Examiner*—Sanza L McClendon
(74) *Attorney, Agent, or Firm*—Westerman, Hattori, Daniels & Adrian, LLP

(57) ABSTRACT

An adhesive composition containing: (a) a thermoplastic resin; (b) a radical-polymerizable compound including two or more (meth)acryloyl groups; (c) a curing agent that generates a radical by photoirradiation of 150 to 750 nm and/or heating at 80 to 200° C.; and (d) a liquid rubber having a viscosity of 10 to 1000 Pa·s at 25° C.

9 Claims, 4 Drawing Sheets

ADHESIVE COMPOSITION, ADHESIVE COMPOSITION FOR CIRCUIT CONNECTION, CONNECTED BODY SEMICONDUCTOR DEVICE

RELATED APPLICATIONS

This is a Divisional application of application Ser. No. 11/138,645 filed May 27, 2005, pending and allowed, which is a continuation-in-part application of PCT application serial no. PCT/JP2003/015351 filed on Dec. 1, 2003, designating the U.S.A., each of which are incorporated herein by reference.

BACKGROUND OF THE INVENTION

1. Field of the Invention

The present invention relates to an adhesive composition, an adhesive composition for circuit connection, a connected body and a semiconductor device.

2. Related Background of the Invention

In a semiconductor element and a liquid crystal display element, various adhesives are used for the purpose of bonding various members in the elements. Such adhesives require a wide variety of properties such as adhesiveness, heat resistance and reliability in a state of high temperature and high humidity. Various base materials, an organic base material such as a printed wiring board and a polyimide, a metal such as copper and aluminum, ITO (Indium tin oxide), SiN, $SiO_2$ and the like, are used as an adherent for adhesion. These base materials have a wide variety of surface conditions. Therefore a molecular design adjusted to each adhered is necessary.

Conventionally, there has been used a thermosetting resin using an epoxy resin exhibiting high adhesiveness and high reliability as an adhesive Japanese Patent Laid-Open Publication No. 1-113480). As the constituent components of the resin, an epoxy resin, a curing agent such as a phenol resin having reactivity with the epoxy resin, and a thermally latent catalyst to enhance a reaction between the epoxy resin and the curing agent are generally used. The thermally latent catalyst is an important factor to determine a curing temperature and a cure rate. Thus, various compounds have been used from the viewpoint of storage stability at room temperature (25° C.) and a cure rate on heating. In an actual process, desired adhesion properties are obtained by curing at a temperature of 170 to 250° C. for 1 to 3 hours. However, due to the recent higher integration of semiconductor elements and higher definition of liquid crystal elements, a pitch between elements and a pitch between wires have been narrower, and thus there is a possibility of adversely affecting the peripheral members due to the heating at the time of curing. In order to achieve a further lower cost, the throughput needs to be improved. Thus adhesion at a low temperature (100 to 170° C.) in a short time (within an hour), that is, adhesion in a low temperature rapid curing is required. In order to achieve the low temperature rapid curing, it is necessary to use a thermally latent catalyst of a low activation energy, however it is known that it is extremely difficult for such thermally latent catalyst to have storage stability around at room temperature at the same time.

Recently, a radical curable adhesive in which a (meth)acrylate derivative, and peroxide as a radical initiator are used together has attracted attention. Since a radical as reaction active species is extremely highly reactive, curing in a short time is possible by radical curing. And a radical initiator exists stable below a temperature of decomposition thereof. Therefore radical curing is a curing system combining a low temperature rapid curing and storage stability around at room temperature (for instance, Japanese Patent Laid-Open Publication No. 2002-203427).

SUMMARY OF THE INVENTION

However, since an adhesive of the radical curing system exhibits a large curing contraction when curing, adhesive strength is poor as compared to a case of using the epoxy resin. Thus the adhesive strength particularly to a base material of an inorganic material or a metal material will deteriorate. For this reason, when the adhesive is used as an adhesive of semiconductor elements or liquid crystal display elements, adequate performance (adhesive strength or the like) can not be obtained.

An object of the present invention is to provide: an adhesive composition which, while being a radical curing system, exhibits high adhesive strength to a base material composed of a metal and an inorganic material, and is excellent in storage stability at room temperature (25° C.), and has adequate performance after reliability tests; and an adhesive composition for circuit connection; a connected body; and a semiconductor device.

In order to achieve the object described above, the present invention provides adhesive composition containing the following components (a) to (d):

(a) a thermoplastic resin;

(b) a radical-polymerizable compound including two or more (meth)acryloyl groups;

(c) a curing agent that generates a radical by photoirradiation of 150 to 750 nm and/or heating at 80 to 200° C. (a curing agent that generates a radical by photoirradiation of 150 to 750 nm or by heating at 80 to 200° C. or by using the photoirradiation and the heating together); and (d) a liquid rubber having a viscosity of 10 to 1000 Pa·s at 25° C.

In the adhesive composition, a thermoplastic resin is added to the adhesive composition of the radical curing system which contains a radical-polymerizable compound including (meth)acryloyl groups as a main object to provide a film forming property, and further with which a liquid rubber of the specific viscosity described above is combined. Thereby, it is possible to achieve high adhesive strength to the base material composed of a metal or an inorganic material or the like. It should be noted that (meth)acryloyl means acryloyl or methacryloyl (the same, hereinafter).

It is preferable that a main framework of the liquid rubber (d) is selected from the group consisting of polyisoprene, polybutadiene, styrene-butadiene copolymer, acrylonitrile-butadiene copolymer, poly(oxypropylene), poly(oxytetramethylene)glycol, polyolefin glycol and poly-ε-caprolactone. In other words, the component (d) is preferably a liquid rubber having a viscosity of 10 to 1000 Pa·s at 25° C. selected from the group consisting of polyisoprene, polybutadiene, styrene-butadiene copolymer, acrylonitrile-butadiene copolymer, poly(oxypropylene), poly(oxytetramethylene)glycol, polyolefin glycol, poly-ε-caprolactone and a modified product thereof.

It is possible to improve wettability to a surface of an adhesion base material so as to achieve high adhesive strength by using these kind of a liquid rubber.

It is preferable that the adhesive composition contains 50 to 250 parts by weight of the component (b), 0.5 to 30 parts by weight of the component (c), and 1 to 50 parts by weight of the component (d) with respect to 100 parts by weight of the component (a). With the compound ratio as described above, adhesive strength, a film forming property, heat resistance, a cure rate, storage stability and the like become more excellent.

The adhesive composition described above may contain 0.1 to 30% by volume of conductive particles with respect to a total volume of the adhesive composition. In other words, the adhesive composition including 0.1 to 30% by volume of the conductive particles with respect to a total 100% volume of the adhesive composition may be obtained.

Compounding the conductive particles to the adhesive composition, it becomes possible to use the adhesive composition as an anisotropic conductive adhesive. For instance, when the anisotropic conductive adhesive is used as an adhesive composition for circuit connection to connect circuit members, each of which includes a circuit electrode on a principal face of a circuit substrate, it is possible to electrically connect the circuit electrodes on the circuit substrates that are faced with each other through the conductive particles, while retaining electrical insulation between the circuit electrodes on the same circuit substrate.

That is, there is provided an adhesive composition for circuit connection consisting of the adhesive composition described above, wherein the adhesive composition for circuit connection bonds circuit members, each of which has a circuit electrode on a principal face of a circuit substrate thereof, to face with each other such that the circuit electrode of one circuit member and the circuit electrode of another circuit member are electrically connected.

The adhesive composition described above is used as the adhesive composition for circuit connection in a circuit connecting method to interpose the adhesive composition for circuit connection between the substrates including the opposed electrodes and pressurize it between the opposed substrates thereby electrically connecting the electrodes in the pressurized direction.

With the use of the adhesive composition for circuit connection, the following connected body and semiconductor device are provided.

A connected body is provided with a first circuit member including a first circuit electrode on a principal face of a first circuit substrate thereof; a second circuit member including a second circuit electrode on a principal face of a second circuit substrate thereof; and a circuit connection member provided between the first circuit member and the second circuit member in a state that the first circuit electrode and the second circuit electrode are faced with each other and electrically connecting the first circuit electrode and the second circuit electrode, wherein the circuit connection member consists of the adhesive composition described above or a cured material thereof.

A semiconductor device is provided with a semiconductor element including a connecting electrode; a circuit member including a circuit electrode on a principal face of a circuit substrate thereof; and a circuit connection member provided between the semiconductor element and the circuit member in a state that the connecting electrode and the circuit electrode are faced with each other and electrically connecting the connecting electrode and the circuit electrode, wherein the circuit connection member consists of the adhesive composition described above or a cured material thereof.

In particular, the following connected body and the semiconductor device will be provided by using the adhesive composition for circuit connection containing the conductive particles.

A connected body is provided with a first circuit member including a first circuit electrode on a principal face of a first circuit substrate thereof; a second circuit member including a second circuit electrode on a principal face of a second circuit substrate thereof; and a circuit connection member provided between the first circuit member and the second circuit member in a state that the first circuit electrode and the second circuit electrode are faced with each other and electrically connecting the first circuit electrode and the second circuit electrode, wherein the circuit connection member consists of the adhesive composition described above or a cured material thereof and the first circuit electrode and the second circuit electrode are electrically connected by the conductive particles in the adhesive composition or the cured material thereof.

A semiconductor device is provided with a semiconductor element including a connecting electrode; a circuit member including a circuit electrode on a principal face of a circuit substrate thereof; and a circuit connection member provided between the semiconductor element and the circuit member in a state that the connecting electrode and the circuit electrode are faced with each other and electrically connecting the connecting electrode and the circuit electrode, wherein the circuit connection member consists of the adhesive composition described above or a cured material thereof, and the connecting electrode and the circuit electrode are electrically connected by the conductive particles in the adhesive composition or the cured material thereof.

DESCRIPTION OF THE PREFERRED EMBODIMENTS

Figure 1:
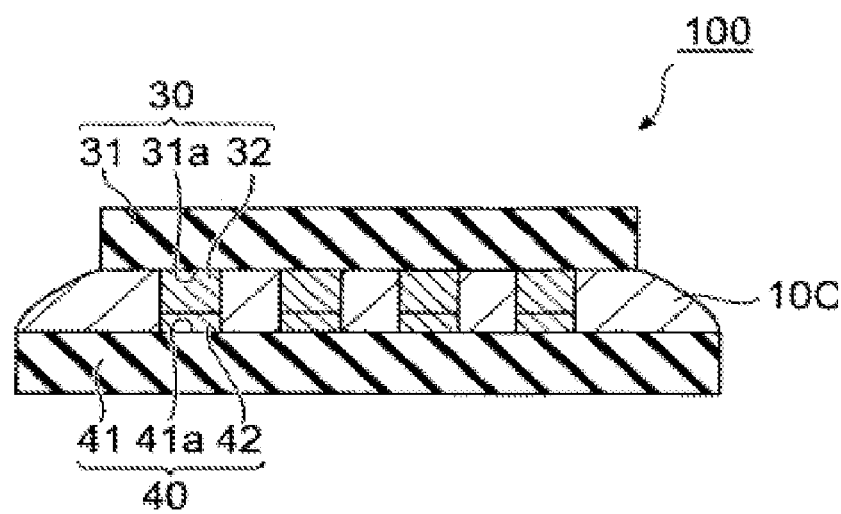
FIG. 1 is a cross-sectional view of a connected body according to an embodiment that is connected with an adhesive composition for circuit connection not containing conductive particles.

Any known thermoplastic resin can be used without restriction in particular as a thermoplastic resin of the component (a) used in the present invention. Polyimide, polyamide, phenoxy resins, poly(meth)acrylates, polyimides, polyurethanes, polyesters, polyvinyl butryals or the like can be used as the polymer described above. These polymers may be used alone, or two or more kinds of them may be mixed for use. Furthermore, the resin may contain a siloxane bond or a fluorine substituent therein. They can be used suitably in a state that the resins to be mixed are completely compatible with each other or become cloudy by generation of microphase separation. The larger a molecular weight of each of the resin described above is, the easier a film forming property can be obtained and further the more extensively a melt viscosity which affects fluidity as an adhesive can be established. The molecular weight is not limited in particular, but as a general weight-average molecular weight, is preferably 5000 to 150000, especially preferably 10000 to 80000. When the value is less than 5000, there is a tendency to deteriorate the film forming property, and when the value exceeds 150000, there is a tendency to deteriorate the compatibility with the other components.

It is possible to use a known radical-polymerizable compound without restriction in particular as a radical-polymerizable compound including two or more (meth)acryloyl groups which is the component (b) used in the present invention.

Specifically, there are listed oligomer such as epoxy (meth)acrylate oligomer, urethane (meth)acrylate oligomer, polyether (meth)acrylate oligomer or polyester (meth)acrylate oligomer and a multifunctional (meth)acrylate compound such as trimethylolpropane tri(meth)acrylate, polyethyleneglycol di(meth)acrylate, polyalkyleneglycol di(meth)acrylate, dicyclopentenyl(meth)acrylate, dicyclopentenyloxyethyl (meth)acrylate, neopentylglycol di(meth)acrylate, dipentaerythritol hexa(meth)acrylate, isocyanuric acid modified bifunctional (meth)acrylate, isocyanuric acid modified trifunctional (meth)acrylate, 2,2'-di(meth)acryloyloxy diethylphosphate or 2-(meth)acryloyloxyethyl acid phosphate. These compounds may be used alone or mixed to be used when needed.

An amount of the component (b) is preferably 50 to 250 parts by weight with respect to 100 parts by weight of the component (a), more preferably 60 to 150 parts by weight. When the amount is less than 50 parts by weight, there is a possibility of decreasing heat resistance after curing, and when the additional amount exceeds 250 parts by weight, there is a possibility of deteriorating the film forming property in case of using as a film.

It is possible to use a known curing agent such as an α-acetaminophenone derivative, a peroxide, an azo compound without restriction in particular, as the curing agent that generates a radical by photoirradiation of 150 to 750 nm and/or heating at 80 to 200° C., the curing agent being the component (c) used in the present invention. Among these compounds, the peroxide is more preferable especially in terms of easiness to establish a curing temperature or the like. It is easy to select an applicable peroxide by referring to a one-minute half life temperature indicating a measure of decomposition of the peroxide. The one-minute half life temperature is preferably in the range from 40° C. to 200° C., more preferably in the range from 60° C. to 170° C. When the one-minute half life temperature is less than 40° C., there is a possibility to lose storage stability, and when the one-minute half life temperature exceeds 200° C., there is a possibility to require a long time for curing.

As the curing agent as described above, there are listed a diacyl peroxide derivative, a peroxydicarbonate derivative, a peroxyester derivative, a peroxyketal derivative, a dialkyl peroxide derivative and a hydroperoxide derivative.

As the diacyl peroxide derivative, there are listed 2,4-dichlorobenzoyl peroxide, 3,5,5-trimethylhexanoyl peroxide, octanoyl peroxide, lauroyl peroxide, stearoyl peroxide, succinic peroxide, benzoyl peroxytoluene, benzoyl peroxide and the like.

As the peroxydicarbonate derivative, there are listed di-n-propylperoxydicarbonate, diisopropylperoxydicarbonate, bis (4-t-butylcyclohexyl)peroxydicarbonate, di-2-ethoxymethoxyperoxydicarbonate, di(2-ethylhexylperoxy) dicarbonate, dimethoxybutylperoxydicarbonate, di(3-methyl-3-methoxybutylperoxy)dicarbonate and the like.

As the peroxyester derivative, there are listed 1,1,3,3-tetramethylbutyl peroxyneodecanoate, 1-cyclohexyl-1-methylethyl peroxyneodecanoate, t-hexyl peroxyneodecanoate, t-butyl peroxypivalate, 1,1,3,3-tetramethylbutyl peroxy-2-ethylhexanoate, 2,5-dimethyl-2,5-bis(2-ethylhexanoyl peroxy)hexane, 2,5-dimethyl-2,5-bis(2-benzoyl peroxy)hexane, 1-cyclohexyl-1-methylethyl peroxy-2-ethylhexanoate, t-hexyl peroxy-2-ethylhexanoate, t-butyl peroxyisobutyrate, 1,1-bis(t-butyl peroxy)cyclohexane, t-hexyl peroxyisopropyl monocarbonate, t-butyl peroxy-3,5,5-trimethylhexanonate, t-butyl peroxy laurate, 2,5-dimethyl-2,5-di(m-toluoyl peroxy)hexane, t-butyl peroxyisopropyl monocarbonate, t-butyl peroxy-2-ethylhexyl monocarbonate, t-hexyl peroxybenzoate, t-butyl peroxyacetate and the like.

As the peroxyketal derivative, there are listed 1,1-bis(t-hexylperoxy)-3,3,5-trimethylcyclohexane, 1,1-bis(t-hexyl peroxy)-3,3,5-trimethylcyclohexane, 1,1-(t-butyl peroxy)cyclododecane, 2,2-bis(4,4-di-t-butyl peroxycyclohexyl)propane, 2,2-bis(t-butyl peroxy)decane and the like.

As the dialkyl peroxide derivative, there are listed α,α'bis (t-butyl peroxy)diisopropylbenzene, dicumyl peroxide, 2,5-dimethyl-2,5-di(t-butyloxy)hexane, t-butylcumyl peroxide and the like.

As hydroperoxides, there are listed diisopropylbenzene hydroperoxide, cumene hydroperoxide and the like.

Besides using the compounds described above alone, two or more kinds of the compounds may be mixed to be used.

An amount of the component (c) is preferably 0.5 to 30 parts by weight with respect to 100 parts by weight of the component (a), more preferably 1 to 20 parts by weight. When the amount is less than 0.5 parts by weight, there is a possibility of inadequate curing, and when the amount exceeds 30 parts by weight, there is a possibility of deteriorating storage stability.

As a liquid rubber of the component (d) used in the present invention, it is possible to use a compound having a viscosity of 10 to 1000 Pa·s (preferably 50 to 800 Pa·s, more preferably 100 to 500 Pa·s, further more preferably 50 to 250 Pa·s) at 25° C. by itself not containing a solvent etc. It should be noted that the viscosity is a value measured at a rotational speed of 0.5 to 50 rpm at 25° C. applying a corn-and-plate geometry by a rotational viscometer (E-type viscometer or the like) of a rotational speed control type. When the viscosity is less than 10 Pa·s, there is a possibility to significantly lower modulus of elasticity after curing in a case where the adhesive composition is used as a film. When the viscosity exceeds 1000 Pa·s, there is a possibility to reduce adhesiveness due to lowered flowability of the film.

As the liquid rubber as described above, polyisoprene, polybutadiene, styrene-butadiene copolymer, acrylonitrile-butadiene copolymer, poly(oxypropylene), poly(oxytetramethylene)glycol, polyolefineglycol, poly-ε-caprolactone and a modified product thereof are especially preferable. At this point, the modified product means a product in which a structure different from a main structure is introduced in a side chain or an end or the like by copolymerizing a monomer including a polymerizable functional group.

As an actual example of the compound described above, there are listed liquid polyisoprene, liquid polybutadiene, carboxyl group end liquid polybutadiene, hydroxyl group end liquid polybutadiene, liquid 1,2-polybutadiene, caboxyl group end liquid 1,2-polybutadiene, hydroxyl group end liquid 1,2-polybutadiene, liquid styrene-butadiene rubber, hydroxyl group end liquid styrene-butadiene rubber, liquid acrylonitrile-butadiene rubber, liquid acrylonitrile-butadiene rubber including a carboxyl group, a hydroxyl group, a (meth)acrylic group or a morpholine group at a polymer end, liquid carboxylic nitrile rubber, hydroxyl group end liquid poly(oxypropylene), alkoxysilyl group end liquid poly(oxypropylene), liquid poly(oxytetramethylene)glycol, liquid polyolefinglycol and liquid poly-ε-caprolactone.

Among these, liquid acrylonitrile-butadiene rubber, liquid acrylonitrile-butadiene rubber including a carboxyl group, a hydroxyl group, a (meth)acryloyl group or a morpholine group at a polymer end and liquid carboxylic nitrile rubber, each of which polarity is relatively high, are more preferable, and the content of acrylonitrile of a polar group is more preferably 10 to 60%. By using such liquid rubber of which polarity is high, adhesive strength can be further enhanced.

Besides using such compounds alone, two or more kinds of the compounds may be used together.

An amount of the component (d) is preferably 1 to 50 parts by weight with respect to 100 parts by weight of the component (a), more preferably 10 to 30 parts by weight. When the amount is less than 1 parts by weight, it tends to be difficult to obtain high adhesive strength, and when the amount exceeds 50 parts by weight, physical properties of the adhesive significantly deteriorates after curing, and thereby, there is a possibility to lower reliability.

As the conductive particles used in the present invention, a metal particle of such as Au, Ag, Ni, Cu and solder, a carbon particle or the like are listed. Further, a particle, which has a nucleus of non-conducting glass, ceramic, plastic or the like to which the metal described above or carbon are coated, may be used. Especially, as the conductive particles, it is preferable to use a particle of which nucleus consists of plastic and coated with the metal or carbon, or a thermally fusible metal particle. Because the particles described above have deformability by heating and pressurizing thereby absorbing variation in the height of the electrodes, the contact area with the electrodes is increased when connecting, thereby improving the connection reliability. In addition, a fine particle produced by further coating the surfaces of such conductive particles with a polymeric resin or the like can suppress a short circuit caused by the contacting between the particles when an amount of compound of the conductive particle is increased, and can improve electrical insulation between the electrode circuits. Therefore, the fine particle may be used alone or mixed with conductive particles to be used appropriately.

An average particle diameter of the conductive particle is preferably 1 to 18 μm in terms of dispersibility and conductivity. When the average particle diameter is less than 1 μm, there may be a case that electrical connection between the circuit electrodes becomes insufficient, and when the average particle diameter exceeds 18 μm, the application to a high-density circuit member of which distance of electrodes is narrow becomes more difficult.

An amount of the conductive particle is not especially limited but is preferably 0.1 to 30% by volume with respect to a total volume of the adhesive composition, more preferably 0.1 to 10% by volume. When the value is less than 0.1% by volume, there is a tendency of deteriorating conductivity, and when the value exceeds 30% by volume, there is a possibility that the circuit is short-circuited. It should be noted that volume % is determined on the basis of a volume of each of the components before curing at 23° C., but the volume of each of the components can be converted from each weight thereof by using specific gravity. It is also possible to determine the volume of the component, based on the increased volume when the component is put into an appropriate solvent (water or alcohol or the like), which does not dissolves and not swells the component and sufficiently moistens the component, in a measuring cylinder or the like.

An additive such as a coupling agent represented by an alkoxysilane derivative or a silazane derivative, an adhesion improver and a leveling agent may be added to the adhesive composition of the present invention appropriately.

In order to improve the rate of crosslinking, a compound including a functional group polymerizable by an active radical such as an allyl group, a maleimide group and a vinyl group besides the component (b) may be added appropriately to the adhesive composition of the present invention. More specifically, there are listed N-vinylimidazole, N-vinylpyridine, N-vinylpyrrolidone, N-vinylformamide, N-vinylcaprolactam, 4,4'-vinylidene bis(N,N-dimethylaniline), N-vinylacetamido, N,N-dimethyl acrylamide, N-isopropyl acrylamide, N,N-diethyl acrylamide, acrylamide and the like.

In order to improve fluidity, a monofunctional (meth)acrylate may be used together with the adhesive composition of the present invention. More specifically, there are listed pentaerythritol (meth)acrylate, 2-cyanoethyl(meth)acrylate, cyclohexyl(meth)acrylate, dicyclopentenyl(meth)acrylate, dicyclopentenyloxyethyl(meth)acrylate, 2-(2-ethoxyethoxy)ethyl(meth)acrylate, 2-ethoxyethyl(meth)acrylate, 2-ethylhexyl(meth)acrylate, n-hexyl(meth)acrylate, 2-hydroxyethyl (meth)acrylate, hydroxypropyl(meth)acrylate, isobornyl (meth)acrylate, isodecyl(meth)acrylate, isooctyl(meth) acrylate, n-lauryl(meth)acrylate, 2-methoxyethyl(meth) acrylate, 2-phenoxyethyl(meth)acrylate, tetrahydrofurfuryl (meth)acrylate, 2-(meth)acryloyloxyethyl phosphate, N,N-dimethylaminoethyl(meth)acrylate, N,N-dimethylaminopropyl(meth)acrylate and (meth)acryloylmorpholine.

The adhesive composition of the present invention can be used in a paste form as it is when the adhesive composition is in a paste form at normal temperature. When the adhesive composition is in a solid state at room temperature, the adhesive composition may be heated for use or made into a paste with the use of a solvent. The applicable solvent is not limited in particular as far as the solvent exhibits no reactivity with the adhesive composition and the additive and has a sufficient solubility. However a boiling point the solvent at normal pressures is preferably in the range of 50 to 150° C. When the boiling point is less than 50° C., there is a possibility that the solvent volatilizes if the solvent is left at room temperature, which therefore limits the use in an open system. And when the boiling point is 150° C. or more, it is difficult to volatilize the solvent, which therefore may adversely affect the reliability after adhesion.

It is suitable to use the adhesive composition of the present invention in a film shape. A solution, in which the solvent or the like is added to the adhesive composition as required, is applied on a exfoliative base material such as a fluororesin film, a polyethylene terephthalate film or a release paper, alternatively a base material such as a nonwoven fabric or the like is impregnated with the solution to be mounted on the exfoliative base material. Then the solvent or the like is removed, thereby enabling the adhesive composition to be used as a film. If the adhesive composition is used in a film shape, it is further convenient in terms of handleability or the like.

The adhesive composition of the present invention can be bonded by photoirradiation and/or heating, or furthermore by simultaneously applying a pressure. Adhering at a lower temperature in a shorter time will be enabled by using them combined. For the photoirradiation, an irradiating light in the wavelength range of 150 to 750 nm is preferable. It is preferable that the adhesive composition is cured at the irradiation amount of 0.1 to 10 J/cm$^2$ using a low pressure mercury lamp, a medium pressure mercury lamp, a high pressure mercury lamp, an ultra-high pressure mercury lamp, a xenon lamp or a metal halide lamp. The heating temperature is not limited in particular, but preferably 50 to 170° C. The pressure is not limited in particular if it is within the range not damaging the adhered, but preferably 0.1 to 10 MPa in general. The heating and pressurizing described above are preferably performed within the range from 0.5 second to 3 hours.

The adhesive composition of the present invention, for instance, can be used as an adhesive for a different kind of adherent having a different thermal expansion coefficient. More specifically, the adhesive composition can be used as a circuit connection material represented by an anisotropic conductive adhesive, silver paste, a silver film or the like, or as a semiconductor element adhesion material represented by elastomer for CSP, an underfill material for CSP, a LOC tape or the like.

The adhesive composition for circuit connection of the present invention is composed of the adhesive composition described above and for instance can be used in order to obtain a connected body or a semiconductor device in which circuit members are connected with each other, as will be described hereinafter.

An embodiment of the connected body and the semiconductor device will be described below with reference to the accompanying drawings. It should be noted that the same element is denoted by the same numerals and duplicated explanations are omitted in the description. Moreover, dimensions in the drawings do not necessarily conform to actual dimensions.

FIG. 1 is a cross-sectional view showing a connected body according to an embodiment using the adhesive composition for circuit connection not containing the conductive particles.

A connected body 100 shown in FIG. 1 is provided with a first circuit member 30 including a first circuit electrode 32 on a principal face 31a of a first circuit substrate 31, a second circuit member 40 including a second circuit electrode 42 on a principal face 41a of a second circuit substrate 41, and a circuit connection member 10C provided between the first circuit member 30 and the second circuit member 40 in a state that the first circuit electrode 32 and the second circuit electrode 42 are faced with each other to electrically connect the first circuit electrode 32 and the second circuit electrode 42. It should be noted that the circuit connection member 10C is composed of a cured material of an adhesive composition for circuit connection 10 (as the adhesive composition for circuit connection, the adhesive composition described above can be applicable). In addition, the first circuit electrode 32 and the second circuit electrode 42 are in contact with each other to be electrically connected.

The connected body 100 shown in FIG. 1 can be manufactured, for instance, as follows.

Figure 2:
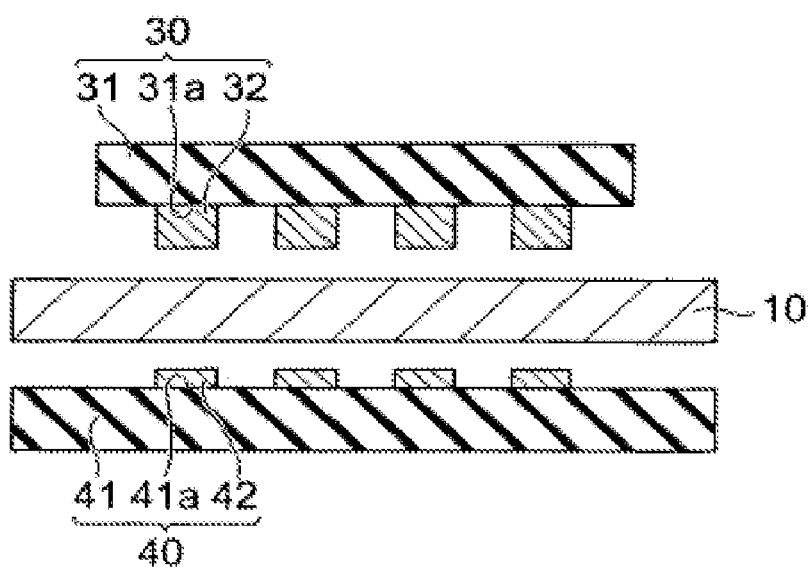
FIG. 2 is a cross-sectional view showing a first circuit member, a second circuit member, and a film-shaped adhesive composition for circuit connection (not containing conductive particles).

First, the first circuit member 30, the second circuit member 40 and the adhesive composition for circuit connection 10 molded in a film shape are prepared as shown in FIG. 2. Then, the adhesive composition for circuit connection 10 is mounted on the side of the second circuit member 40 on which the second circuit electrode 42 is formed, and the first circuit member 30 is mounted on the adhesive composition for circuit connection 10 such that the first circuit electrode 32 and the second circuit electrode 42 are faced with each other. Subsequently, the adhesive composition for circuit connection 10 is heated through the first circuit member 30 and the second circuit member 40 to be cured, and simultaneously is pressurized in a direction perpendicular to the principal faces 31a and 41a to form a circuit connection member 10C between the first circuit member 30 and the second circuit member 40, by which the connected body 100 of FIG. 1 is obtained.

Figure 3:
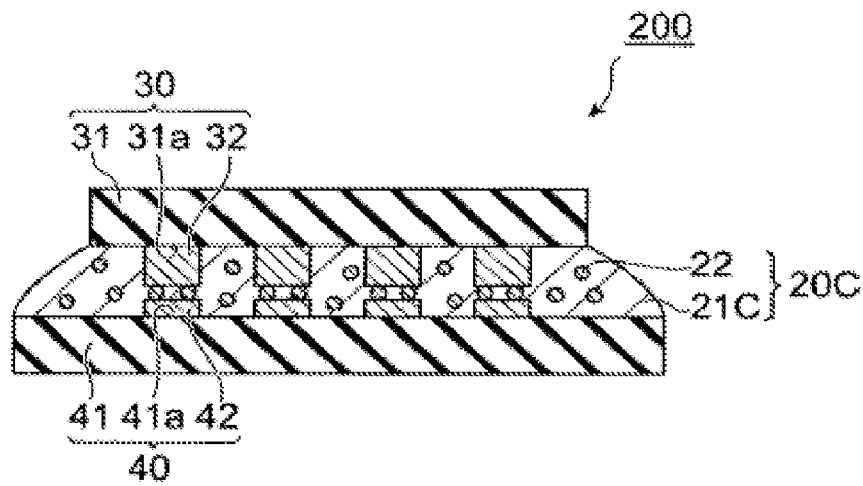
FIG. 3 is a cross-sectional view showing a connected body according to an embodiment that is connected with an adhesive composition for circuit connection containing conductive particles.

FIG. 3 is a cross-sectional view showing a connected body according to the embodiment using the adhesive composition for circuit connection containing conductive particles.

A connected body 200 as shown in FIG. 3 is provided with the first circuit member 30 including the first circuit electrode 32 on the principal face 31a of the first circuit substrate 31, the second circuit member 40 including the second circuit electrode 42 on the principal face 41a of the second circuit substrate 41, and a circuit connection member 20C provided between the first circuit member 30 and the second circuit member 40 in a state that the first circuit electrode 32 and the second circuit electrode 42 are faced with each other to electrically connect the first circuit electrode 32 and the second circuit electrode 42. It should be noted that the circuit connection member 20C is a cured material of an adhesive composition for circuit connection 20 in which conductive particles 22 are dispersed in a resin composition 21 (that is, a product in which the conductive particles 22 are dispersed in a cured material 21c of the resin composition). And the conductive particles 22 are in contact with the both circuit electrodes in between the first circuit electrode 32 and the second circuit electrode 42 which are faced with each other, and thus, the both circuit electrodes are electrically connected through the conductive particles 22.

Figure 4:
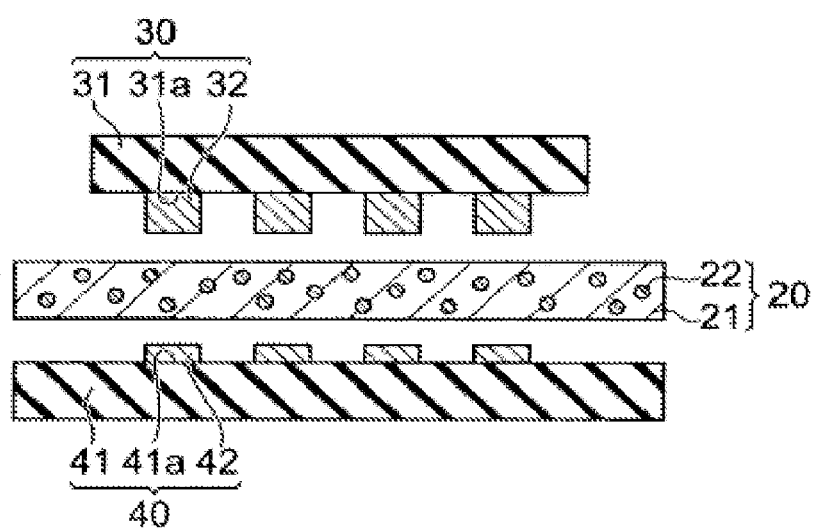
FIG. 4 is a cross-sectional view typically showing a first circuit member, a second circuit member, and a film-shaped adhesive composition for circuit connection (containing conductive particles).

For instance, the connected body 200 shown in FIG. 3 can be manufactured by preparing the first circuit member 30, the second circuit member 40, and the adhesive composition for circuit connection 20 molded in a film shape as shown in FIG. 4 with the same method as the method to obtain the connected body 100 of FIG. 1 described above. It should be noted that the adhesive composition for circuit connection 20 is a composition in which the conductive particles 22 are dispersed in the resin composition 21, wherein it is possible to apply the adhesive composition described above (provided conductive particles are not included) as the resin composition 21.

As a material composing the circuit substrate, an inorganic material such as a semiconductor, glass and ceramic, an organic material such as polyimide and polycarbonate or a composite material including glass fiber/epoxy resin or the like can be used alone or combined to be used.

As an actual example of the circuit member including the circuit electrode, a liquid crystal display element, a tape carrier package (TCP), a 2-layers-structure flexible printed circuit (FPC) or the like are listed, which are combined to be a connected body in which the circuit electrodes are electrically connected.

Figure 5:
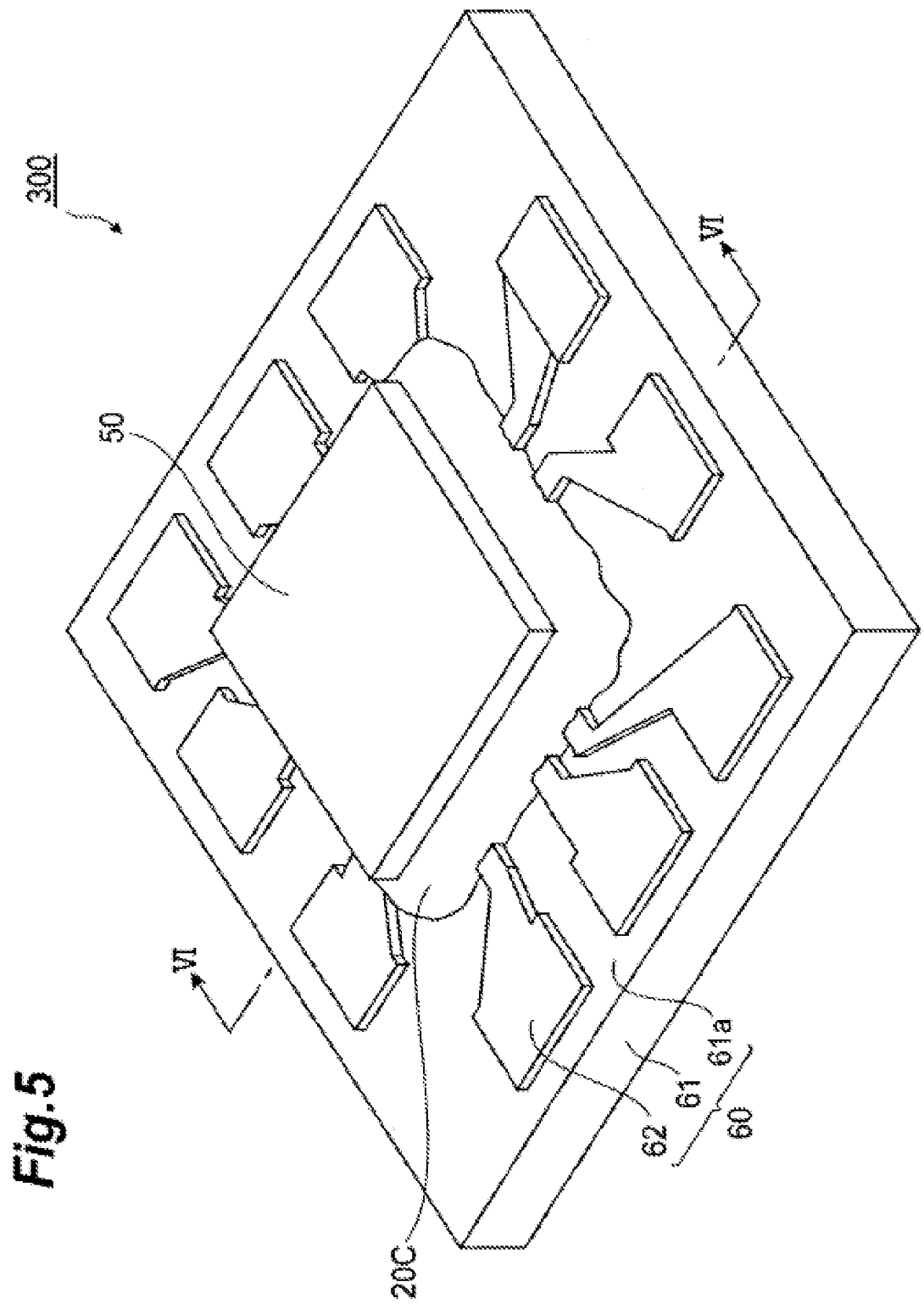
FIG. 5 is a perspective view of a semiconductor device according to an embodiment.

FIG. 5 is a perspective view of a semiconductor device according to the embodiment. The semiconductor device is an example of a semiconductor device, wherein in a circuit connecting method to interpose the adhesive composition for circuit connection between an electrode of a semiconductor element and an electrode of an on-board (a circuit member) substrate facing each other, and to pressurize the electrode of the semiconductor element and the electrode of the opposed on-board substrate (the circuit member), thereby electrically connecting the electrodes in the pressurized direction, the adhesive composition described above is used for connection as the adhesive composition for circuit connection.

A semiconductor device 300 shown in FIG. 5 is provided with a semiconductor element 50, a circuit member 60 including a circuit electrode 62 on a principal face 61a of a circuit substrate 61, a circuit connection member 20C provided between the semiconductor element 50 and the circuit member 60 in a state that a connecting electrode of the semiconductor element 50 and the circuit electrode 62 are faced with each other. At this point, the circuit electrode 62 and the connecting electrode of the semiconductor element 50 (shown as a connecting electrode 52 in FIG. 6) are electrically connected.

Figure 6:
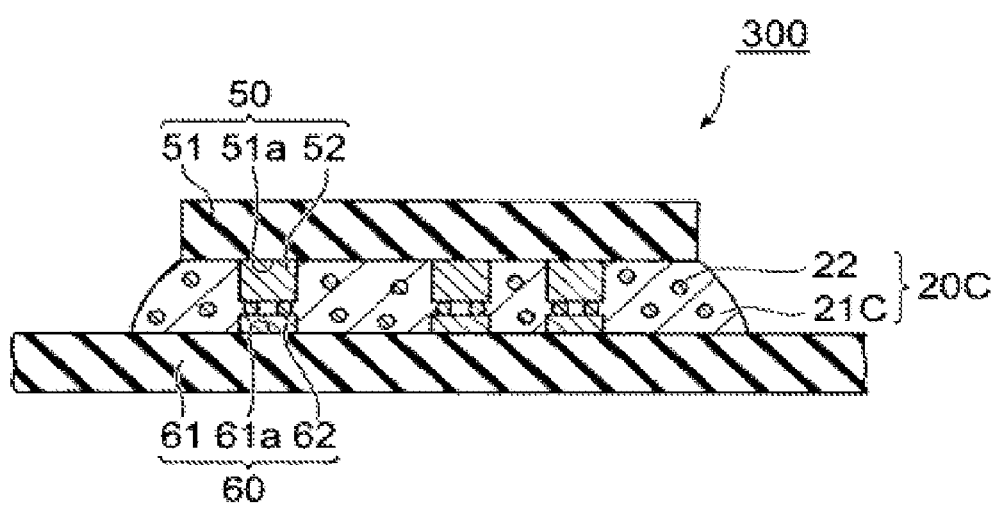
FIG. 6 is a cross-sectional view taken along a line VI-VI of FIG. 5.

FIG. 6 is a cross-sectional view taken along a line VI-VI of FIG. 5.

The semiconductor device 300 shown in FIG. 6 is provided with the semiconductor element 50 including the connecting electrode 52 on a principal face 51a of a semiconductor element body 51, the circuit member 60 including the circuit electrode 62 on the principal face 61a of the circuit substrate 61, and the circuit connection member 20C provided between the semiconductor element 50 and the circuit member 60 in a state that the connecting electrode 52 and the circuit electrode 62 are faced with each other to electrically connect the connecting electrode 52 and the circuit electrode 62. At this point, the circuit connection member 20C is a cured material of the adhesive composition for circuit connection 20 wherein the conductive particles 22 are dispersed in the resin composition 21 (that is, a product in which the conductive particles 22 are dispersed in the cured material 21C of the resin composition). Thus, the conductive particles 22 are in contact with the both circuit electrodes in between the circuit electrode 52 and the circuit electrode 62 which are faced with each other, and thereby the both circuit electrodes are electrically connected via the conductive particles 22.

The semiconductor device 300 can be manufactured by preparing the semiconductor element 50, the circuit member 60 and the adhesive composition for circuit connection 20 with the same method as the method to obtain the connected body 100 of FIG. 1 described above.

As an actual example of the semiconductor device, a device, in which an IC chip as the semiconductor element and a chip-connecting board are connected, and the like are listed.

EXAMPLES

Hereinafter, the present invention will be described on the basis of the examples more specifically but is not limited to them.

Examples 1-2

Comparative Example 1

As the thermoplastic resin (a), 40 g of phenoxy resin (PKHC, trade name of Union Carbide Corporation, average molecular weight 45000) was dissolved in 60 g of methylethylketone to prepare a solution of a solid content of 40 weight %. An isocyanuric acid EO modified diacrylate (M-215, trade name of Toagosei Co., Ltd.) and a 24-meth) acryloyloxy ethyl phosphate (Light-Ester P-2M, trade name of Kyoeisha Co., Ltd.) were used as the radical-polymerizable compound (b), and 1,1-bis(t-hexylperoxy)-3,3,5-trimethylcyclohexane (perhexa TMH, trade name of Nippon Oil & Fats Co., Ltd.) was used as the curing agent (c), and a liquid acrylonitrile-butadiene rubber (Nipol 1312 or Nipol DN601, trade name of Nihon Zeon Co., Ltd.) were used as the liquid rubber (d). When the viscosity of the liquid rubber at 25° C. by itself was measured at 1 rpm of a rotor rotational speed using an E-type viscometer EHD2557 manufactured by Tokyo Keiki Co., Ltd., Nipol 1312 showed 183 Pa·s and Nipol DN601 showed 225 Pa·s. Additionally, a nickel layer of 0.2 μm in thickness was provided on a surface of a particle of which nucleus was a polystyrene, and a gold layer of 0.02 μm in thickness was provided on an outside of the nickel layer, by which conductive particles with an average particle diameter of 5 μm and specific gravity of 2.5 were produced.

A film-shaped adhesive of which adhesive layer was 15 μm in thickness was obtained by compounding the agents at a solid weight ratio as shown in table 1, furthermore by compounding and dispersing 1.5% by volume of the conductive particles into the agents to be applied to a fluororesin film of 80 μm in thickness using a coating device, and by hot-air drying at 70° C. for 10 minutes.

TABLE 1

| Agents | | Example 1 | Example 2 | Comparative Example 1 | Comparative Example 2 |
|---|---|---|---|---|---|
| thermoplastic resin | PKHC | 50 | 50 | 50 | 50 |
| radical-polymerizable compound | M-215 | 45 | 45 | 45 | 45 |
| | Light-Ester P-2M | 5 | 5 | 5 | 5 |
| curing agent | perhexa TMH | 3 | 3 | 3 | 3 |
| liquid rubber | Nipol 1312 | 5 | — | — | — |
| | Nipol DN601 | — | 5 | — | — |
| solid rubber | Nipol HF01 | — | — | — | 5 |

[Measurement of Adhesive Strength and Connection Resistance]

With the use of the film-shaped adhesive obtained by the manufacturing process described above, a two-layers-structure flexible printed circuit (FPC) including 500 copper circuits with a line width of 50 μm, a pitch of 100 μm and thickness of 8 μm on a polyimide film of 38 μm in thickness and glass (with a thickness of 1.1 μm, surface resistance 20Ω/□), in which a thin layer of ITO of 0.2 μm in thickness was formed thereon, were heated and pressurized at 160° C. and at 3 MPa for 10 second to connect over the width of 2 mm using a thermocompression bonding device (heating type: constant heating type, manufactured by Toray Engineering Co., Ltd.) thereby manufacturing a connected body. The resistance value between adjacent circuits of the connected body was measured by a multimeter immediately after adhesion and after having been retained in a high temperature and high humidity bath at 85° C. and 85% RH for 120 hours. The resistance value is shown in an average of 150 resistance points between the adjacent circuits (X+3σ, σ: standard deviation).

Further, adhesive strength of the connected body was measured and evaluated by a 90 degree peeling method according to JIS-Z0237. At this point, Tensilon UTM-4 manufactured by Toyo Baldwin Co., Ltd. (peeling speed 50 mm/min, 25° C.) was used as a measurement device of adhesive strength. The results of measured adhesive strength and connection resistance of the connected body as described above were shown in table 2.

Comparative Example 2

Except that 5 parts by weight of nitrile rubber which is in a solid state at 25° C. (Nipol HF01, trade name of Nihon Zeon Co., Ltd.) was used as a substitute of the liquid rubber of the example 1, a film-shaped adhesive was manufactured and evaluated in the same way as the example 1. It should be noted that as Nipol HF01 is in a solid state at 25° C., viscosity measurement of the rubber by itself was impossible.

TABLE 2

| items | Connection Resistance (Ω) | | Adhesive Strength (N/m) | |
|---|---|---|---|---|
| | immediately after adhesion | After 120 hrs | immediately after adhesion | After 120 hrs |
| Example 1 | 2.3 | 2.5 | 700 | 600 |
| Example 2 | 1.8 | 2.8 | 800 | 750 |
| Comparative Example 1 | 2.8 | 8.4 | 200 | 150 |
| Comparative Example 2 | ≧10Ω | ≧10Ω | 230 | 200 |

The adhesive compositions obtained in the examples 1 and 2 showed excellent connection resistance and adhesive strength immediately after adhesion and after having been retained in a high temperature and high humidity bath at 85° C. and 85% RH for 120 hours, and has high durability. In contrast, in a case where the liquid rubber according to the present invention was not used (Comparative Example 1), although an excellent value of the connection resistance was shown immediately after adhesion, the connection resistance increased after having been retained in a high temperature and high humidity bath at 85° C. and 85% RH for 120 hours, and a low value of the adhesive strength is shown immediately after adhesion and after having been retained in a high temperature and high humidity bath at 85° C. and 85% RH for 120 hours. Furthermore, in comparative example 2, in which the rubber that is solid-state at 25° C. was added, the connection resistance became higher and the adhesive strength became lower, and therefore, it was impossible to obtain a satisfactory connected body.

Example 3

After the film-shaped adhesive obtained in the example 1 was vacuum-packaged and left at 40° C. for 5 days, FPC and ITO were heated and pressure-bonded in the same way. The connection resistance was 2.1Ω and the adhesive strength was 760 N/m immediately after adhesion, and the connection resistance was 2.9Ω and the adhesive strength was 700 N/m after having been retained in a high temperature and high humidity bath at 85° C. and 85% RH for 120 hours. It was understood that the excellent values, which were the same as those before being left, were shown and storage stability was superior both immediately after adhesion and after the reliability test.

Example 4

With the exception of using 3 parts by weight of 1,1,3,3-tetramethylbutyl peroxy-2-ethylhexanoate (Perocta O, trade name of Nippon Oil & Fats Co., Ltd.) as the curing agent (c), the film-shaped adhesive is manufactured and evaluated in the same way as the example 1. As a result, the adhesive strength was 900 N/m immediately after adhesion and 750 N/m after having been retained in high temperature and high humidity at 85° C. and 85% RH for 120 hours, and the connection resistance was 1.7Ω immediately after adhesion and 2.3Ω after having been retained in high temperature and high humidity at 85° C. and 85% RH for 120 hours. That is, excellent adhesive strength and connection resistance were shown both immediately after adhesion and after reliability test.

According to the present invention, it is possible to provide a adhesive composition, an adhesive composition for circuit connection, a connected body and a semiconductor device which exhibits higher adhesion properties in curing at a low temperature in a short time, and is superior in storage stability.

What is claimed is:

1. A film-shaped adhesive composition comprising the following components (a) to (d):
    (a) a thermoplastic resin;
    (b) a radical-polymerizable compound including two or more (meth)acryloyl groups;
    (c) a curing agent that generates a radical by photoirradiation of 150 to 750 nm and/or heating at 80 to 200° C.; and
    (d) a liquid rubber having a viscosity of 10 to 1000 Pa·s at 25° C.

2. An adhesive composition according to claim 1, wherein the component (d) is a liquid rubber having a viscosity of 10 to 1000 Pa·s at 25° C. selected from the group consisting of polyisoprene, polybutadiene, styrene-butadiene copolymer and acrylonitrile-butadiene copolymer.

3. An adhesive composition according to claim 1, comprising:
    50 to 250 parts by weight of the component (b);
    0.5 to 30 parts by weight of the component (c); and
    1 to 50 parts by weight of the component (d),
    with respect to 100 parts by weight of the component (a).

4. An adhesive composition according to claim 1, comprising 0.1 to 30% by volume of conductive particles with respect to a total volume of the adhesive composition.

5. An adhesive composition for circuit connection comprising the adhesive composition according to claim 1,
    wherein the adhesive composition for circuit connection is capable of bonding circuit members, each of which has a circuit electrode on a principal face of a circuit substrate thereof, to face with each other such that the circuit electrode of one circuit member and the circuit electrode of another circuit member are electrically connected.

6. A connected body comprising:
    a first circuit member including a first circuit electrode on a principal face of a first circuit substrate thereof;
    a second circuit member including a second circuit electrode on a principal face of a second circuit substrate thereof; and
    a circuit connection member provided between the first circuit member and the second circuit member in a state that the first circuit electrode and the second circuit electrode face each other and electrically connecting the first circuit electrode and the second circuit electrode,
    wherein the circuit connection member comprises the adhesive composition according to claim 1 or a cured material thereof.

7. A connected body comprising:
    a first circuit member including a first circuit electrode on a principal face of a first circuit substrate thereof;
    a second circuit member including a second circuit electrode on a principal face of a second circuit substrate thereof; and
    a circuit connection member provided between the first circuit member and the second circuit member in a state that the first circuit electrode and the second circuit electrode face each other and electrically connecting the first circuit electrode and the second circuit electrode,
    wherein the circuit connection member comprises the adhesive composition according to claim 4 or a cured material thereof, and the first circuit electrode and the second circuit electrode are electrically connected by the conductive particles in the adhesive composition or the cured material thereof.

8. A semiconductor device comprising:

a semiconductor element including a connecting electrode;

a circuit member including a circuit electrode on a principal face of a circuit substrate thereof; and a circuit connection member provided between the semiconductor element and the circuit member in a state that the connecting electrode and the circuit electrode face each other and electrically connecting the connecting electrode and the circuit electrode, wherein the circuit connection member comprises the adhesive composition according to claim 1 or a cured material thereof.

9. A semiconductor device comprising:

a semiconductor element including a connecting electrode;

a circuit member including a circuit electrode on a principal face of a circuit substrate thereof; and a circuit connection member provided between the semiconductor element and the circuit member in a state that the connecting electrode and the circuit electrode face each other and electrically connecting the connecting electrode and the circuit electrode, wherein the circuit connection member comprises the adhesive composition according to claim 4 or a cured material thereof, and the connecting electrode and the circuit electrode are electrically connected by the conductive particles in the adhesive composition or the cured material thereof.

* * * * *